United States Patent [19]

Gasner et al.

[11] 4,135,955
[45] Jan. 23, 1979

[54] PROCESS FOR FABRICATING HIGH VOLTAGE CMOS WITH SELF-ALIGNED GUARD RINGS UTILIZING SELECTIVE DIFFUSION AND LOCAL OXIDATION

[75] Inventors: John T. Gasner, Melbourne; Anthony L. Rivoli, Palm Bay, both of Fla.

[73] Assignee: Harris Corporation, Cleveland, Ohio

[21] Appl. No.: 835,263

[22] Filed: Sep. 21, 1977

[51] Int. Cl.² .................. H01L 21/22; H01L 29/78
[52] U.S. Cl. .................................. 148/187; 29/571; 148/1.5; 357/23; 357/42; 357/50; 357/52
[58] Field of Search ............... 148/1.5, 187; 29/571; 357/23, 42, 52, 50

[56] References Cited

U.S. PATENT DOCUMENTS

| | | | |
|---|---|---|---|
| 3,673,428 | 6/1972 | Athanas | 357/42 X |
| 3,853,633 | 12/1974 | Armstrong | 148/187 X |
| 3,983,620 | 10/1976 | Spadea | 357/91 X |
| 4,006,491 | 2/1977 | Alaspa et al. | 357/42 X |
| 4,013,484 | 3/1977 | Buleky et al. | 148/187 X |
| 4,027,380 | 6/1977 | Deal et al. | 29/571 |

Primary Examiner—G. Ozaki
Assistant Examiner—W. G. Saba
Attorney, Agent, or Firm—Leitner, Palan, Martin & Bernstein

[57] ABSTRACT

Complementary MOS devices having spaced guard rings are fabricated by applying an oxide layer to an N substrate with an opening for doping P-type impurities to form a well, applying a nitride layer over a portion of the oxide and of the well portions, doping the area in the well between the nitride and the oxide to form P-type guard rings, masking the well and adjacent portion of the oxide, doping the area between the mask and the exposed nitride layer to form N-type guard rings and exposing the substrate to an oxidizing atmosphere to oxidize the substrate except where covered by the nitride layer. The nitride layer is removed and standard device processing is used to form complementary MOS in the areas previously covered by the nitride.

The resulting integrated circuit includes a P-type guard ring extending laterally from the outer edge of the N-channel source and drain to the edge of the P-type well and a N-type guard ring extending laterally from the outer edge of the P-channel device source and drain to a point adjacent, but spaced from the P-type well. The inner lateral edges of the guard rings are laterally aligned with the outer edges of the source and drains and the top surface of the guard rings are vertically displaced from the top surface of the source and drains by the oxide formed in the substrate.

15 Claims, 6 Drawing Figures

PROCESS FOR FABRICATING HIGH VOLTAGE CMOS WITH SELF-ALIGNED GUARD RINGS UTILIZING SELECTIVE DIFFUSION AND LOCAL OXIDATION

BACKGROUND OF THE INVENTION

The present invention generally relates to integrated circuits and more specifically to an improved method for forming high density integrated circuits containing complementary field effect transistors including guard rings.

Integrated circuits presently being used require power supply voltage greater than five volts. To achieve this, the turn on voltage of the field or parasitic thick oxide devices must be increased above the supply voltage. This is difficult to achieve in a high performance integrated process involving complementary MOS devices with polysilicon gates and ion implanted source and drains. One method to achieve higher field thresholds is by first increasing the size of the silicon dioxide steps on the chip resulting in larger final integrated chip size due to photoresist limitations, and secondly by increasing the P- and N-type background doping levels in the wafer, which degrades the device performance.

Another method uses guard rings or channel stops which are regions of very high impurity doping concentrations surrounding each N- and P-channel thin oxide MOS device. The high doping concentration increases the field threshold so high that the drain to source breakdown voltage of the thin oxide devices becomes the limiting factor of the IC power supply voltage. The rings generally require no extra processing steps because they are defined at the same time that the P and N channel devices are formed. This process is illustrated by U.S. Pat. No. 3,983,620. Separate processing steps for the guard rings and the source and drain is illustrated in U.S. Pat. No. 4,013,484. The guard rings must be separated from each surrounding device to prevent electrical shorts and adjacent rings must not touch. A ring separation of zero results in a process trade off of final device sheet resistivity versus field threshold and device breakdown voltage.

Local oxidation has been used in the formation of MOS devices as illustrated in U.S. Pat. Nos. 3,752,711 and 3,913,211. Since these patents deal generally with single polarity MOS devices, they do not treat the problems involved with forming two different conductivity type guard rings and their interaction. Similarly, the sequence of steps required to produce CMOS devices are not described therein.

Thus there exists a need for providing a method and an integrated circuit to form self-aligned guard rings in complementary integrated field effect transistor circuits to overcome the problems faced by prior art devices and techniques.

SUMMARY OF THE INVENTION

The present method and integrated circuit forms complementary insulated gate field effect transistors wherein guard rings are laterally spaced from each other at their outer edge and are aligned at their inner lateral edge with the outer lateral edges of the source and drain of their respective insulated gate field effect transistor. An insulative layer formed in and above the substrate surface causes the top surface of the guard ring to be vertically displaced from the top surface of the respective source and drain. Using an N-conductivity type substrate and a P-type well formed therein, the $P^+$ guard ring formed has its outer lateral edge coincident with the outer lateral edge of the P-well.

The process of fabrication begins with applying an oxide layer on the substrate with an opening for defining a P-type well to be formed therein, followed by doping the exposed surface of the substrate to form a P-type well. A nitride mask layer is then applied over a portion of the oxide and a portion of the well to define areas under the nitride layer in which the complementary insulated gate field effect transistors will be formed. P-type impurities are then introduced into the exposed surface of the P-type well between the edge of the oxide layer and the nitride layer covering a portion of the well to form a P-type guard ring. A masking layer is then applied over the total well and adjacent portions of the oxide and N-type impurities are introduced through the oxide between the exposed nitride layer and the masking layer into the substrate to form N-type guard rings spaced from the previously formed P-type guard ring. The masked layer is then removed and the substrate is then exposed to an oxidizing atmosphere to oxidize the surface of the substrate, except where covered by the nitride layer, so as to form the substrate area vertically displaced from the N- and P-type guard rings formed and having a vertically aligned lateral edge. The nitride layer is then removed and standard processing steps are used to form insulated gate field effect transistor devices in the exposed substrate surfaces defined by the oxide layer.

OBJECTS OF THE INVENTION

An object of the present invention is to provide a process for forming complementary insulated gate field effect transistors capable of high voltage operation without a loss in chip real estate or device performance.

Another object of the present invention is to provide a process and structure allowing more flexibility in the selection of doping levels under the thin oxide region.

A further object of the invention is to provide a process of fabrication of guard rings whose edges are self-aligned or coincident with the source and drain regions of the devices they surround.

Other objects, advantages, and novel features of the invention will become apparent from the following detailed description of the invention when considered in conjunction with the accompanying drawings.

DESCRIPTION OF THE PREFERRED EMBODIMENTS

Figure 1:
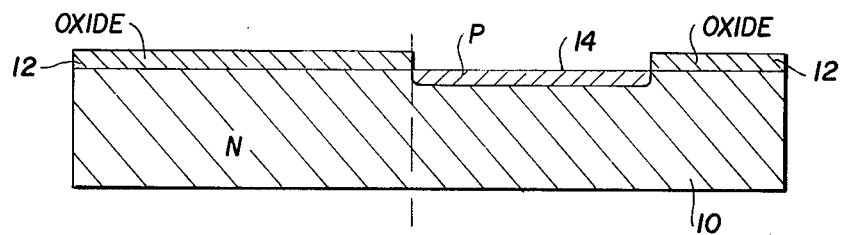
FIGS. 1-5 are cross-sectional views illustrating the process steps used in fabricating the self-aligned N- and P-conductivity type guard rings using local oxidation.
Figure 5:
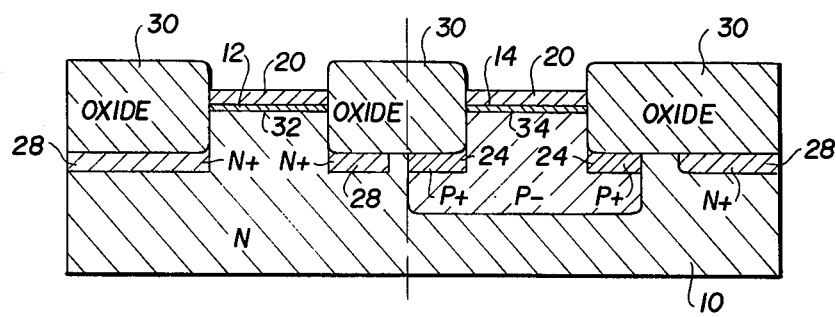
Figure 6:
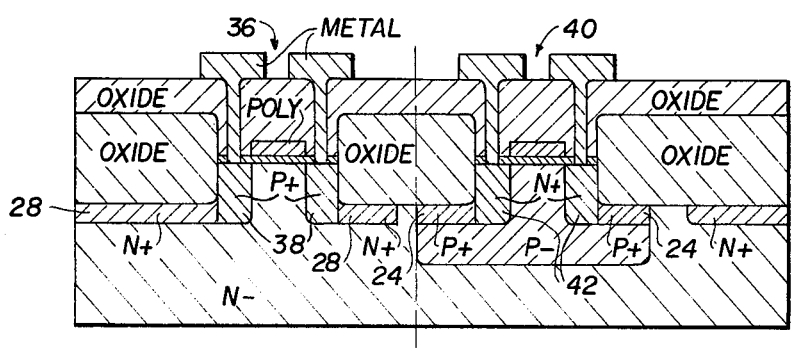
FIG. 6 is a cross-sectional view illustrating complementary insulated gate field effect transistors formed in the substrate prepared by FIGS. 1-5.

The process of fabrication of the self-aligned guard rings illustrated in FIGS. 5 and 6 begins as illustrated in FIG. 1 with a substrate 10, for example, N-type silicon having a relatively thin oxide level 12 grown thereon. A standard masking technique is then used to define an opening formed in the oxide layer 12 to expose surface area 14 into which is deposited P-type impurities, for example, boron, as illustrated in FIG. 1. Oxide layer 12 must be thick enough to mask against the P-type impurity doping steps forming the well 18 and the P+ guard ring 24.

Figure 2:
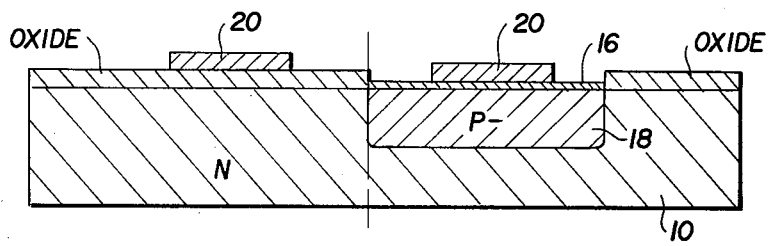

A thin oxide region 16 is grown over the surface 14 and the boron impurities are diffused to an appropriate junction depth to form the P− well 18. Considering oxide layer 12, the first masking layer, a second masking layer 20 of, for example, silicon nitride, is formed over the substrate and delineated so as to form a mask portion on the oxide layer 16 above the P− well 18 and a portion on oxide layer 12 above the substrate 10, as illustrated in FIG. 2. As will become apparent from the subsequent description, the nitride layer must be thick enough to mask against the field oxidation and the impurity doping used to form the P- and N-conductivity type guard rings. The area below the nitride mask illustrated in FIG. 2 will become the thin oxide regions into which the source and drain and gate of both the P- and N-channel device will be formed.

Figure 3:
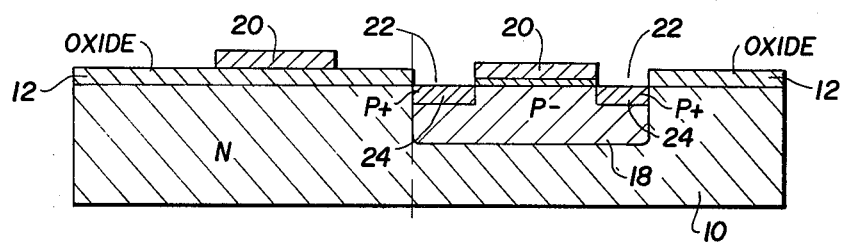

Openings 22 are formed by etching, for example, in oxide layer 16 to expose the portion of surface 14 of P− well 18 into which the P-type guard rings are to be formed. The exposed surface between the oxide layer 12 and the nitride layer 20, noted as openings 22, are doped with P-type impurities, for example, boron by deposition and diffusion, to form P+ guard ring 24. It should be noted that by using the original opening in oxide layer 12, the outer lateral edge of the P+ guard rings are coincidental with the lateral edge of the P− well 18. Similarly, by using the nitride mask layer 20, the inside lateral edges of the P+ ring 24 will be aligned laterally with the source and drains of the N-channel device to be formed in the P− well 18. The thickness of nitride layer 20 and the thickness of the oxide layer 12 are sufficient to mask the P+ impurity doping so as to limit them to the areas defined by openings 22. The structure at this point in the process is illustrated in FIG. 3.

Figure 4:
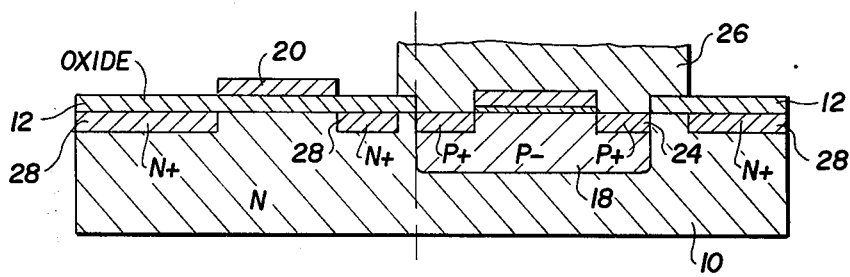

A third mask layer 26 is applied and delineated by well-known delineation techniques to totally cover or mask the P− well 18 and adjacent portions of the substrate 10 as illustrated in FIG. 4. N-type impurities, for example, phosphorous, are then doped in the exposed regions of oxide layer 12 between the mask layer 26 and the exposed nitride layer 20 to form N+ guard rings 28 in the substrate. By making masking layer 26 cover adjacent portions of the substrate adjacent to P− well 18 the finally formed N+ guard ring is spaced from the P+ guard ring 24 and the P− well 18. Although the oxide layer 12 was sufficient to mask the P+ impurity doping forming guard ring 24, it is not sufficiently thick to prevent the formation of the N+ guard ring 28.

Although the formation of P− well 18, P+ guard ring 24, and N+ guard ring 28 has been described and illustrated as being formed by deposition and diffusion, these regions may be formed by ion implantation, the essence being the formation of the masking layers and the self-alignment of the inner lateral edges of the guard rings with the to-be-formed source and drains of their respective insulated gate field effect transistors and the separation of the outer edges of the guard rings from each other.

The mask layer 26 is then removed and the substrate is exposed to an oxidizing atmosphere to grow field oxide in all the regions except those masked with the nitride layer 20. As illustrated in FIG. 5, the final oxide layer 30 has grown in the substrate 10 as well as above the substrate so as to vertically isolate substrate surface portions 32, and 34 of the substrate from the P+ and N+ guard rings 24 and 28. The oxide layer 30 should be sufficiently thick to mask against subsequent diffusion forming the source and drain regions. Although the guard rings 24 and 28 are slightly vertically separated from the surface 34 of the substrate, the interior lateral edges of the guard rings are substantially coincidental vertically with the edge of the field oxide layer 30. This is illustrated in FIG. 5.

The nitride layer 20 and the remaining portions of oxide layer 12 and 16 thereunder are stripped to expose substrate surface regions 32 and 34. The formation of complementary insulated gate field effect transistors is then performed using the field oxide 30 as a mask in a standard process. This includes growing gate oxide on exposed surface regions 32 and 34, depositing and defining, for example, polysilicon gates on the gate oxide, using the polysilicon formed gate and the field oxide as a mask to form the source and drains of the respective P- and N-channel devices. A final oxide layer is deposited thereon and metal contacts are made to the source and drains and gates of the P- and N-channel devices.

The final configuration, as illustrated in FIG. 6, shows a P-channel device 36 having a source and drain regions 38 vertically displaced from but contiguous with the N+ guard rings 28 and having their outer lateral edges aligned with the inner lateral edges of the guard ring 28. Similarly, an N channel device 40 has N+ source and drain regions 42 vertically displaced from but contiguous with the P+ guard ring 24 and their outer lateral edges are aligned with the inner lateral edges of the guard rings 24. Thus a process has been described which provides an integrated circuit having complementary insulated gate field effect transistors wherein the guard rings are formed separated from each other and have their interior lateral edges self-aligned with the exterior lateral edges of the source and drain of their respective channel devices.

From the preceding description of the preferred embodiments, it is evident that the objects of the invention are obtained in that a high voltage, high density complementary insulated gate field effect transistors are formed using self-aligned techniques and localized oxidation. Although the invention has been described and illustrated in detail, it is to be clearly understood that the same is by way of illustration and example only and is not to be taken by way of limitation. Although the formation of the impurity regions of the substrate were described as using deposition and diffusion, it is obvious that the same may be formed by ion implantation. Similarly, the substrate may be of P-conductivity type and an N-type well would be formed therein. Other insulated gate field effect devices other than CMOS devices may be formed in the substrate with the self-aligned guard rings. The spirit and scope of this invention is to be limited only by the terms of the appended claims.

What is claimed is:

1. A process for preparing a substrate of a first conductivity type for the fabrication of CMOS devices comprising:
    forming a first mask layer on said substrate to define a first area for a first MOS device and guard ring;
    doping said first area with an impurity of a second conductivity type to form a well region;
    forming a second mask layer on said first mask layer and said well region to define a second area for a second MOS device and a third area for said first MOS device, respectively;
    doping said well region between said first and second mask layers with an impurity of said second conductivity type to form a guard ring of said second conductivity type;

forming a third mask layer over said first area;

doping the area between said third mask layer and said second mask layer with an impurity of said first conductivity type to form a guard ring of said first conductivity type;

removing said third mask layer; and increasing the thickness of said first mask layer in areas not covered by said second mask layer.

2. The process according to claim 1 further including removing said second mask layer before fabricating said MOS devices.

3. The process according to claim 1 wherein said first mask layer is sufficient to mask said doping of impurities of said second conductivity type but not sufficient to mask doping impurities of said first conductivity type.

4. The process according to claim 1 wherein said third mask layer extends over portions of said first mask layer adjacent said first area whereby said guard rings are formed spaced-apart.

5. The process according to claim 1 wherein said first mask layer is oxide and it is increased by exposing said surfaces to an oxidizing atmosphere.

6. The process according to claim 5 wherein said second mask layer is a nitride of sufficient thickness to prevent oxidation of the surface below the nitride layer.

7. The process according to claim 5 wherein the oxidizing is performed for a sufficient amount of time to displace said guard rings vertically from the surface of said substrate.

8. The process according to claim 1 wherein said substrate is silicon, said first mask layer is silicon oxide, and said second mask layer is silicon nitride.

9. The process according to claim 1 wherein said first conductivity type is N-type and said second conductivity type is P-type, and said doping is formed by deposition and diffusion.

10. The process according to claim 1 wherein said first mask layer is an oxide, said first mentioned doping step includes diffusion whereby a thin layer of oxide is formed over said first area, said second mask layer is formed over a portion of said thin oxide layer, and the exposed portion of said thin oxide layer are removed before said second mentioned doping step.

11. A process of fabricating CMOS devices and guard rings using self alignment comprising:

forming an oxide layer on a substrate with an opening exposing a first area;

doping said first area with impurities of a first conductivity type;

forming a first mask layer on said oxide layer over a second area and in said opening over a third area;

doping a portion of said first area between said oxide and said third area with impurities of said first conductivity type to form a first guard ring of first conductivity type;

forming a second mask layer over said first area and adjacent portions of said oxide layer;

doping the area between said second mask layer and said second area with impurities of a second conductivity type to form a second guard ring of said second conductivity type spaced from said first guard ring;

removing said first and second mask layer; and fabricating CMOS devices in said second and third areas wherein the source and drains are aligned with said guard rings.

12. The process according to claim 11 including after removing said second mask layer and before removing first mask layer, introducing an oxidizing atmosphere to increase the oxide layer in all areas not covered by said first mask layer.

13. The process according to claim 12 wherein the oxidizing is performed for a sufficient amount of time to displace said guard rings vertically from the surface of said substrate.

14. The process according to claim 11 wherein said oxide layer is formed sufficiently thick to mask doping of said first conductivity type impurities but not said second conductivity type impurities.

15. The process according to claim 11 wherein said substrate is silicon, said oxide is silicon ioxide and said first mask layer is silicon nitride.

* * * * *

UNITED STATES PATENT AND TRADEMARK OFFICE
CERTIFICATE OF CORRECTION

PATENT NO. : 4,135,955
DATED : January 23, 1979
INVENTOR(S) : Gasner et al.

It is certified that error appears in the above-identified patent and that said Letters Patent are hereby corrected as shown below:

Col 1, line 38 change "is" to -- are -- ;

line 52 change "are" to -- is -- ;

Col 3, line 18 change "device" to -- devices -- ;

Col 4, line 23 change "regions" to -- region -- ;

line 39 delete "a"

line 53 change "is" to -- are -- ;

Col 6, line 1 change "are" to -- is -- ;

line 42 change "ioxide" to -- dioxide -- !

Signed and Sealed this

Twenty-fifth Day of September 1979

[SEAL]

Attest:

Attesting Officer

LUTRELLE F. PARKER
*Acting Commissioner of Patents and Trademarks*